(12) United States Patent
Lee et al.

(10) Patent No.: US 7,842,606 B2
(45) Date of Patent: Nov. 30, 2010

(54) METHOD OF DEPOSITING THIN FILM AND METHOD OF MANUFACTURING SEMICONDUCTOR USING THE SAME

(75) Inventors: Ki Hoon Lee, Yongin-si (KR); Young Hoon Park, Anseong-si (KR); Sahng Kyoo Lee, Seoul (KR); Tae Wook Seo, Suwon-si (KR); Ho Seung Chang, Seoul (KR)

(73) Assignee: Integrated Process Systems Ltd, Pyungtaek-si (KR)

( * ) Notice: Subject to any disclaimer, the term of this patent is extended or adjusted under 35 U.S.C. 154(b) by 180 days.

(21) Appl. No.: 11/720,450

(22) PCT Filed: Nov. 28, 2005

(86) PCT No.: PCT/KR2005/004012

§ 371 (c)(1),
(2), (4) Date: May 30, 2007

(87) PCT Pub. No.: WO2006/059851

PCT Pub. Date: Jun. 8, 2006

(65) Prior Publication Data

US 2008/0166887 A1 Jul. 10, 2008

(30) Foreign Application Priority Data

Dec. 4, 2004 (KR) .................. 10-2004-0101474

(51) Int. Cl.
*H01L 21/4763* (2006.01)
*H01L 21/02* (2006.01)

(52) U.S. Cl. .................. 438/636; 438/72; 438/952; 257/437; 257/E21.029

(58) Field of Classification Search ............. 438/780, 438/636, 72, 952; 257/437, E21.029
See application file for complete search history.

(56) References Cited

U.S. PATENT DOCUMENTS 5,227,196 A * 7/1993 Itoh .................. 427/249.1

(Continued)

FOREIGN PATENT DOCUMENTS

KR 1999019538 3/1999

OTHER PUBLICATIONS

International Search Report; PCT/KR2005/004012; Mar. 28, 2006.
Written Opinion; PCT/KR2005/004012; Mar. 28, 2006.

(Continued)

*Primary Examiner*—Ha Tran T Nguyen
*Assistant Examiner*—Aaron A Dehne
(74) *Attorney, Agent, or Firm*—Jae Y. Park; Kile Park Goekjian Reed & McManus PLLC

(57) ABSTRACT

Disclosed herein are a method of depositing a thin film and a method of manufacturing a semiconductor using the same, having high selectivity by increasing etching resistance while an extinction coefficient associated with anti-reflectivity is maintained low. The method of depositing a thin film according to the invention includes (a) depositing an carbon anti-reflective film on the bottom film of a substrate; and (b) adding a compound containing nitrogen (N), fluorine (F) or silicon (Si) to the surface or the inner portion of the carbon anti-reflective film, to deposit a thin film of a-C:N, a-C:F or a-C:Si, having high selectivity, to a thickness from 1 to 100 nm using an atomic layer deposition process. Therefore, an ultrathin film having etching resistance is formed on or in the carbon anti-reflective film and the density and compressive stress of the carbon anti-reflective film are increased, thus increasing etching selectivity.

11 Claims, 3 Drawing Sheets a-C:N (3$^{rd}$ point)

a-C a-C:N (2$^{nd}$ point)

a-C a-C:N (1$^{st}$ Point)

U.S. PATENT DOCUMENTS

| | | |
|---|---|---|
| 6,428,894 B1 * | 8/2002 | Babich et al. ............... 428/408 |
| 6,573,030 B1 * | 6/2003 | Fairbairn et al. ............ 430/323 |
| 7,084,071 B1 * | 8/2006 | Dakshina-Murthy et al. .......................... 438/717 |
| 2003/0219988 A1 * | 11/2003 | Shan et al. .................. 438/725 |
| 2005/0202683 A1 * | 9/2005 | Wang et al. ................. 438/763 |
| 2007/0116888 A1 * | 5/2007 | Faguet ........................ 427/569 |

OTHER PUBLICATIONS

International Preliminary Report on Patentability; PCT/KR2005-004012; Mar. 22, 2007.

All the reference cited in the Search Report, Written Opinion and Preliminary Report are listed above.

* cited by examiner

[Fig. 1]
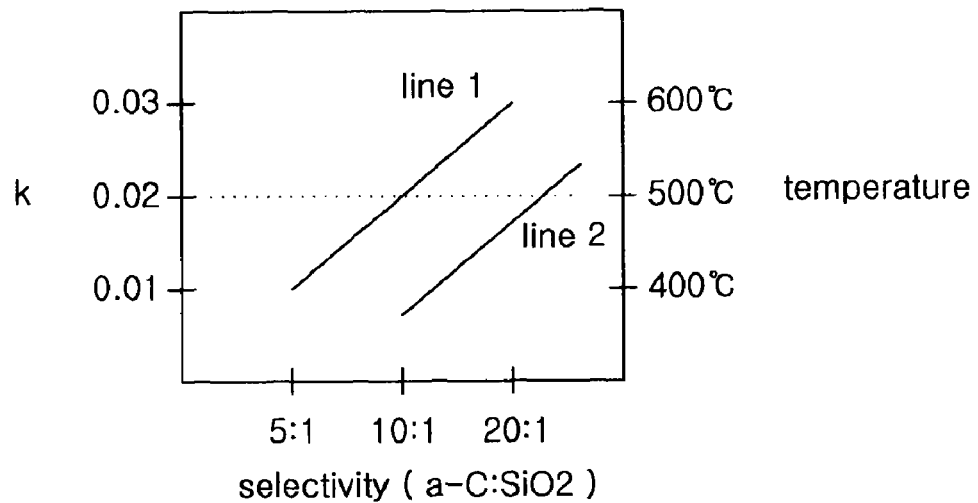
[Fig. 2]
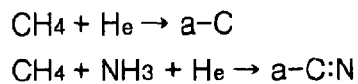
$CH_4 + He \rightarrow a\text{-}C$
$CH_4 + NH_3 + He \rightarrow a\text{-}C\text{:}N$
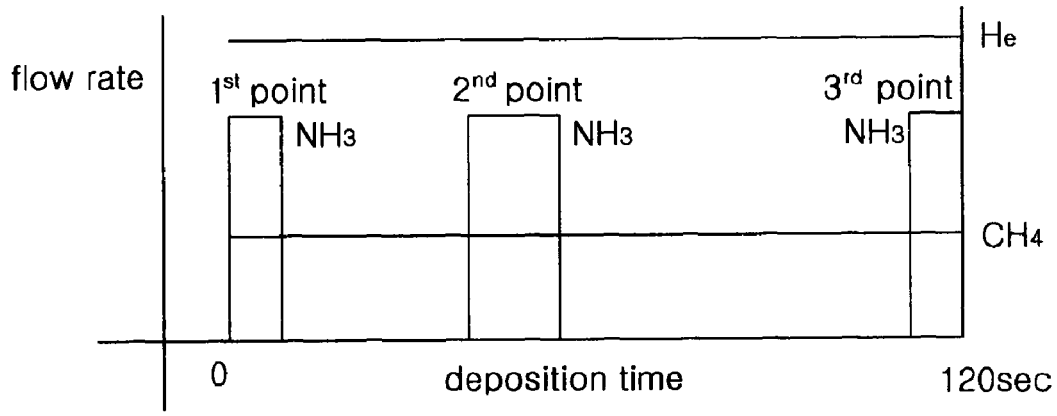
[Fig. 3]
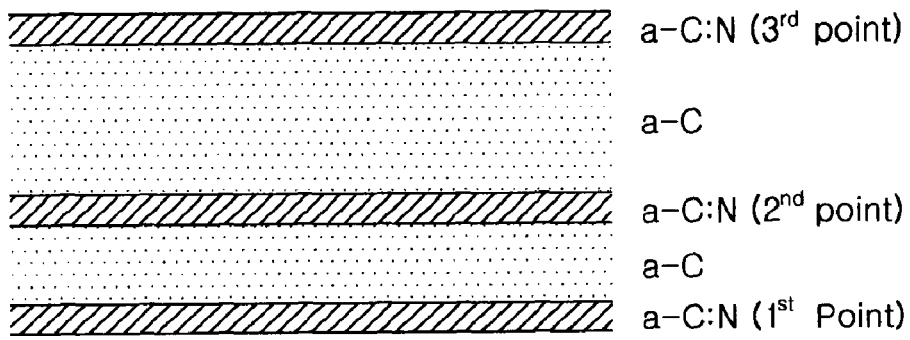

[Fig. 4]
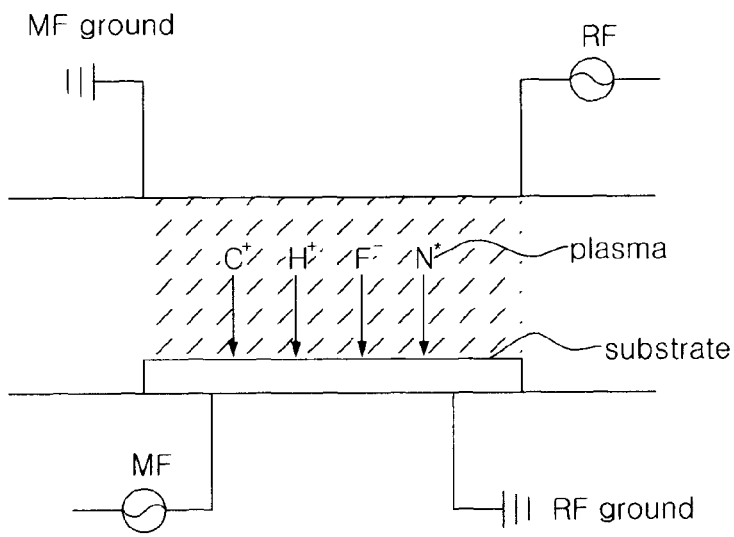
[Fig. 5]
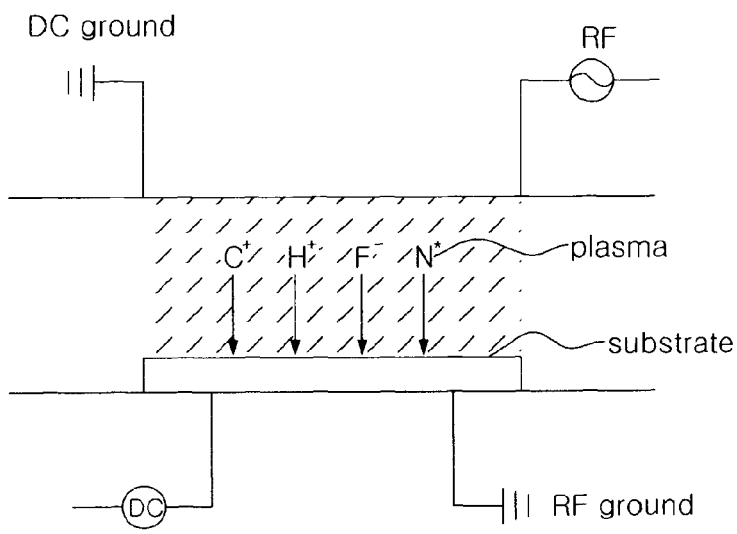
[Fig. 6]
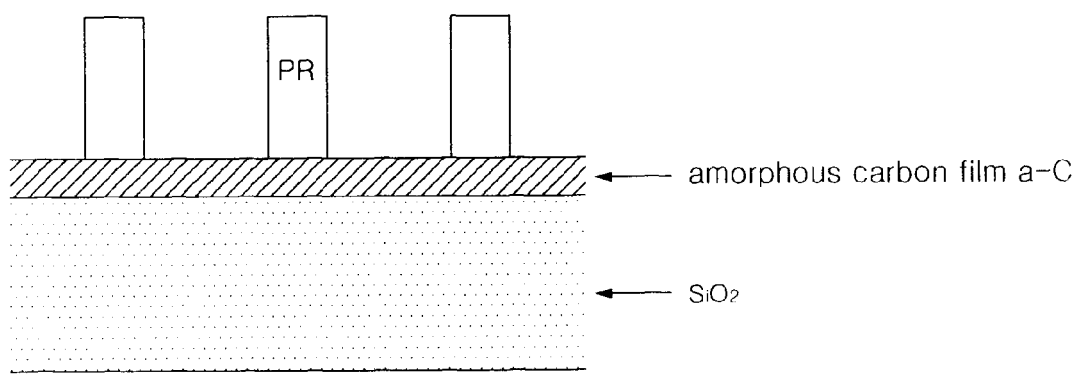

[Fig. 7]
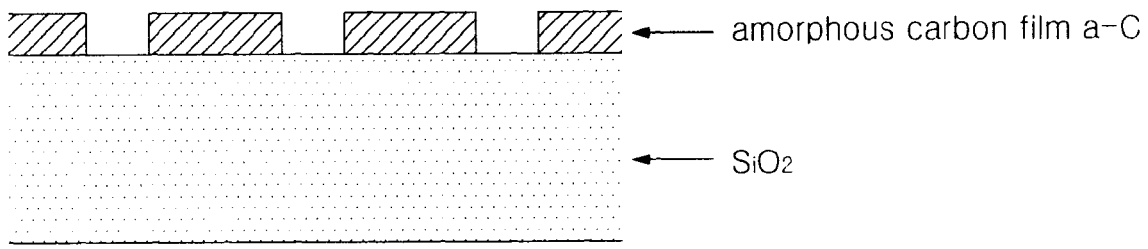
← amorphous carbon film a-C
← SiO₂
[Fig. 8]
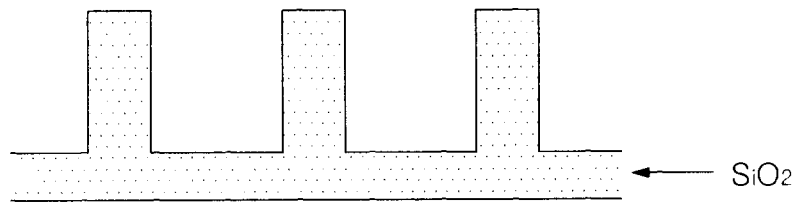
← SiO₂

METHOD OF DEPOSITING THIN FILM AND METHOD OF MANUFACTURING SEMICONDUCTOR USING THE SAME

TECHNICAL FIELD

The present invention relates generally to a method of manufacturing a semiconductor device, and, more particularly, to a method of manufacturing a semiconductor device using an amorphous carbon anti-reflective film.

BACKGROUND ART

Since the degree of integration of almost all highly integrated semiconductor devices having high capacities, such as DRAMs or FRAMs, is doubled every year, the degree of difficulty encountered in semiconductor manufacturing processes is further increasing.

In particular, since a design rule required for a pattern formation process for use in the formation of fine pattern becomes small, it is important to suppress variations in notching or critical dimensions generated during the pattern formation process.

To this end, an anti-reflective film having a low refractive index should be deposited on a bottom film which is to be patterned, to minimize the irregular reflection or diffraction of radiated light of 365 nm or 248 nm. Such an anti-reflective film is exemplified by a nitrided-oxide film, such as SiON. However, the nitrided-oxide film suffers because it causes defects and entails complicated processes. Therefore, there is need for a novel anti-reflective film. From this point of view, an amorphous carbon anti-reflective film is advantageous because it can be inexpensively used for an actual process and be simply manufactured, with excellent applicability.

Although an organic carbon anti-reflective film for realization of high etching selectivity has been typically used as a bottom anti-reflective coating (BARC), which is removed along with a photo-resist, it presently serves as a hard mask upon etching of an oxide film by rather decreasing the selectivity. This is because a general photo-resist has a soft polymer structure, whereas the amorphous carbon anti-reflective film has an sp3 structure as a dense three-dimensional network structure and a planar sp2 structure to exhibit high etching resistance.

Hence, techniques for varying the characteristics of such an amorphous carbon film to maintain optical properties and control selectivity are urgently required.

FIG. 1 is a graph showing the variation in optical properties and etching selectivity depending on the deposition temperature of an organic carbon anti-reflective film.

The amorphous organic carbon anti-reflective film is commonly deposited using plasma. As in FIG. 1, when the deposition temperature is increased, it is not easy to increase hardness and an extinction coefficient (k) associated with anti-reflectivity, due to the expanded graphite structure, therefore resulting in delayed actual application of the amorphous organic carbon anti-reflective film to a semiconductor process.

DISCLOSURE OF INVENTION

Technical Solution

Accordingly, the present invention has been made keeping in mind the above problems occurring in the prior art, and an object of the present invention is to provide a method of manufacturing a semiconductor, suitable for the formation of an amorphous carbon anti-reflective film having high selectivity by increasing etching resistance while maintaining a low extinction coefficient.

Another object of the present invention is to provide an apparatus for manufacturing a semiconductor, suitable for the formation of an amorphous carbon anti-reflective film having high selectivity by increasing etching resistance while maintaining a low extinction coefficient.

In order to accomplish the above objects, the present invention provides a method of manufacturing a semiconductor, suitable for the formation of an amorphous carbon anti-reflective film on a semiconductor substrate, the method comprising (a) depositing an amorphous organic carbon film on the bottom film of the semiconductor substrate; and (b) adding a compound containing nitrogen (N), fluorine (F) or silicon (Si) to the surface or the inner portion of the amorphous organic carbon film, to deposit a thin film of a-C:N, a-C:F or a-C:Si, having high selectivity, to a thickness from ones to tens of nm using an atomic layer deposition process.

In addition, the present invention provides a method of manufacturing a semiconductor, suitable for the formation of an amorphous carbon anti-reflective film on a semiconductor substrate, the method comprising (a) depositing an amorphous organic carbon film on the bottom film of the semiconductor substrate; and (b) applying RF power, together with either MF power or DC power, to the substrate having the amorphous organic carbon film deposited thereon for ionization and deposition of a carbon source gas, to form a large amount of plasma ions, and applying the plasma ions to a wafer to cause an ion impact effect, thus increasing the density of the film, resulting in increased compressive stress.

In addition, the present invention provides an apparatus for manufacturing a semiconductor, suitable for use in the formation of an amorphous carbon anti-reflective film on a semiconductor substrate, the apparatus comprising an RF power portion and an MF power portion for applying RF power and MF power, respectively, to the semiconductor substrate having the amorphous carbon anti-reflective film deposited thereon for ionization and deposition of a carbon source gas in a process chamber, in which the amorphous carbon anti-reflective film having increased density and compressive stress due to the dual frequencies of the RF power and MF power is formed on the semiconductor substrate.

In addition, the present invention provides an apparatus for manufacturing a semiconductor, suitable for use in the formation of an amorphous carbon anti-reflective film on a semiconductor substrate, the apparatus comprising an RF power portion and a DC power portion for applying RF power and DC power, respectively, to the semiconductor substrate having the amorphous carbon anti-reflective film deposited thereon for ionization and deposition of a carbon source gas in a process chamber, in which the amorphous carbon anti-reflective film having increased density and compressive stress due to the dual frequencies of the RF power and DC power is formed on the semiconductor substrate.

In addition, the present invention provides a method of manufacturing a semiconductor using an amorphous organic carbon film as an anti-reflective film and a hard mask, the method comprising (a) depositing the amorphous organic carbon film on an oxide film of a semiconductor substrate, after which the amorphous organic carbon film is coated with a photo-resist, exposed, and then etched, to form a pattern; (b) removing the photo-resist; and (c) etching the oxide film using $CF_4$ or $CHF_3$ as an etching gas having high selectivity with respect to the amorphous organic carbon film and the oxide film.

DESCRIPTION OF DRAWINGS

FIG. 1 is a graph showing optical properties and etching selectivity varying with the deposition temperature of an organic carbon film;

FIG. 2 is a view schematically showing a process of manufacturing a semiconductor for the formation of an amorphous carbon anti-reflective film, according to the present invention;

FIG. 3 is a view schematically showing the amorphous carbon anti-reflective film resulting from the introduction of a source gas in FIG. 2;

FIGS. 4 and 5 are views schematically showing apparatuses for manufacturing a semiconductor for the formation of an amorphous carbon anti-reflective film, according to the present invention; and FIGS. 6 to 8 are views sequentially showing a process of manufacturing a semiconductor for the realization of a trenching process using an organic carbon film as an anti-reflective film and a hard mask, according to the present invention.

MODE FOR INVENTION

Hereinafter, a detailed description will be given of the present invention, with reference to the appended drawings.

In general, an organic carbon film using plasma is formed in a manner such that a gas mixture comprising an organic gas, such as $CH_4$, $C_2H_6$, $C_2H_4$, $C_2H_2$, $C_3H_8$, etc., and an inert gas, such as He, Ar, Ne, etc., is deposited through the application of plasma. In the common case of using a Deep UV light source of 248 nm, a thickness of about 1,500 Å is required. The optical properties of the organic carbon film depend on the total thickness of the carbon film and the bandgap of the constituent atoms thereof.

Further, the etching properties of the organic carbon film vary with the chemical reactivity of an etching gas, such as $CF_4$ or $CHF_3$, on the film, and the surface hardness, corresponding to resistance to ion impact.

Thus, if a film of a-C:N or a-C:F may be uniformly deposited to a thickness from ones of to tens of nm on or in the organic carbon film using an element N or F in order to increase the chemical resistance and hardness upon film deposition, etching resistance can be improved. In addition, since the deposited film has a thickness corresponding to 1/tens to 1/hundreds of 248 nm, that is, the wavelength of the light source, it can exhibit transparency with respect to the corresponding light source, thus minimizing the decrease of optical properties.

FIG. 2 shows a process of forming the amorphous carbon anti-reflective film according to the present invention, using an atomic layer deposition process to form an ultra-thin film on or in the organic carbon film.

For example, in the case where an amorphous organic carbon film, as exemplified by $CH_4+He \rightarrow $ a-C:H, is deposited on the bottom film of a semiconductor substrate, a process of continuously introducing $CH_4$ and He gases into a process chamber is conducted, along with supplying as much $NH_3$ as desired at necessary points, such as a first point (10 sec) at beginning of the deposition, a second point (5 sec), and a third point (5 sec) at conclusion of the deposition, thus forming a film as shown in $CH_4+NH_3+He \rightarrow $ a-C:N.

As such, if the bottom film is formed of Si or Ti to enable easy reaction with carbon, $N_2$ and $NH_3$ gases are introduced into the chamber to form plasma, thereby preferably obtaining a nitride film having a thickness of tens of Å.

FIG. 3 schematically shows the amorphous carbon anti-reflective film resulting from the introduction of the source gas as in FIG. 2.

As is apparent from FIG. 3, the ultra-thin film having high etching resistance to etching gas may be formed at any desired point among film deposition points. Since the ultra-thin film is much thinner than the wavelength of I-line (365 nm) and Deep UV (248 nm) generally used for a semiconductor process, it does not affect the total optical properties of the carbon film having a thickness of thousands of Å.

This is because the ultra-thin film having a changed composition is too thin for the wavelength to interfere therewith, thus causing no interference or diffraction. Moreover, the a-C:N film has high hardness and excellent chemical stability to oxide-etching gas, such as $CHF_3$, and thus, the initial reaction time of an etchant is limited and the surface hardness is increased, thus improving the selectivity thereof.

Also, the film thickness or frequency is adjusted, whereby the selectivity can be precisely controlled. In this way, examples of elements, capable of reacting using an atomic layer deposition process, include an N source, such as $N_2$ or $NH_3$, and an F source, such as $F_2$, $CF_4$ or $C_2F_6$. In addition, the element Si is formed into SiC on the surface of the film, thus exhibiting the same effect as the above elements. In addition to $SiH_4$, various organic metal sources including HMDS may be used.

FIGS. 4 and 5 show apparatuses for manufacturing a semiconductor for the formation of an amorphous carbon anti-reflective film according to the present invention, in which the amorphous carbon anti-reflective film having increased density and compressive stress using dual frequencies is formed on a semiconductor substrate.

The application of the compressive stress to the thin film leads to increased density. Consequently, upon etching, the partial loss of the sputtered film by ion impact or the removal of an etching product resulting from the reaction with F ions is suppressed, and thus an etching speed is decreased, resulting in increased selectivity. However, since the physical thickness of the amorphous organic film or the bandgap as inherent properties of the constituent atoms thereof is not drastically changed, the extent of variation of the optical properties thereof is negligible. Hence, the film characteristics are efficiently controlled, and thus the optical properties of the anti-reflective film are maintained and etching resistance is increased to obtain high etching selectivity.

FIG. 4 shows an apparatus for applying both RF power and MF power to a substrate for ionization and deposition of a carbon source gas. When such an apparatus is used, the plasma ionization efficiency is increased, forming large amounts of ions, which can then be accelerated to the substrate.

FIG. 5 shows an apparatus for applying both RF power and DC power to a substrate for ionization and deposition of a carbon source gas. When such an apparatus is used, the plasma ionization efficiency is increased, forming large amounts of ions, which can then be accelerated to the substrate.

As shown in FIGS. 4 and 5, the density of the film is increased by ions colliding with the film for deposition, and compressive stress is applied, therefore increasing etching resistance.

FIGS. 6 to 8 show a process of sequentially manufacturing a semiconductor using an organic carbon film as an anti-reflective film and a hard mask, according to the present invention.

As shown in FIG. 6, an amorphous carbon film is deposited on an oxide film, coated with a photo-resist, exposed, and then etched, to form a pattern.

In this case, the amorphous carbon film functions as an anti-reflective film so as to suppress irregular reflection and diffraction of a light source on the bottom film formed of a high reflective material, thus suppressing variation in notching or critical dimensions. Further, since both the photo-resist and the amorphous carbon film are an organic carbon film, they can be easily removed using $O_2$ plasma.

As shown in FIG. 7, after the pattern is formed, the photo-resist is removed. Thereby, only the amorphous organic carbon film is patterned on the oxide film.

As shown in FIG. 8, the oxide film is etched using an etching gas, such as $CF_4$ or $CHF_3$, having high selectivity with respect to the amorphous organic carbon film and the oxide film. As the selectivity of the organic carbon film is increased, the oxide film can be etched as deeply as desired.

As described above, the present invention provides a method and apparatus for manufacturing a semiconductor. According to the present invention, an ultra-thin film having etching resistance is formed on or in an amorphous carbon anti-reflective film, and the density and compressive stress of the amorphous carbon anti-reflective film are increased, thus increasing etching selectivity.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A method of depositing a thin film on a semiconductor substrate, the method of comprising:
   (a) depositing a carbon anti-reflective film on a bottom film of the semiconductor substrate while applying both RF power and MF power to the substrate; and
   (b) adding a compound containing nitrogen (N), fluorine (F) or silicon (Si) for at least two limited periods of time to deposit at least two thin films of a-C:N, a-C:F or a-C:Si to at least two of a bottom surface, an inner portion, and a top surface of the carbon anti-reflective film, wherein the at least two thin films have high selectivity and are deposited to thicknesses of 1 to 100 nm using an atomic layer deposition process,
   wherein the at least two limited periods of time are non-contiguous in time such that a layer of carbon anti-reflective film is deposited between the at least two thin films, and
   wherein the adding step (b) occurs while the depositing step (a) occurs such that both the adding step (b) and the depositing step (a) simultaneously occur during the at least two limited periods of time.

2. The method as set forth in claim 1, wherein the adding of the compound in (b) is conducted by introducing liquid and gas having a corresponding element, including $N_2$, $NH_3$, $F_2$, $CF_4$, $C_2F_6$, SiC, $SiH_4$ or HMDS, into a process chamber at one or more points selected from a first point at beginning of deposition, a second point, and a third point at conclusion of the deposition.

3. The method as set forth in claim 1, wherein the thin film has a thickness of 1/100 to 1/10 times a wavelength of a lithographic light source.

4. The method as set forth in claim 1, further comprising applying RF power together with MF power to the substrate having the carbon anti-reflective film deposited thereon for ionization and deposition of a carbon source gas, to form a large amount of plasma ions, and applying the plasma ions to a wafer to cause an ion impact effect, thus increasing a density of the film, resulting in increased compressive stress.

5. The method as set forth in claim 1, wherein if the bottom film is formed of Si or Ti to enable easy reaction with carbon, $N_2$ or $NH_3$ gas is introduced into the process chamber to form plasma, thus forming a nitride film having a thickness of 1 to 100 nm.

6. A method of manufacturing a semiconductor using a carbon anti-reflective film, the method of comprising:
   (a) depositing the carbon anti-reflective film on a bottom film of the semiconductor substrate while applying both RF power and MF power to the substrate;
   (b) adding a compound containing nitrogen (N), fluorine (F) or silicon (Si) for at least two limited periods of time to deposit at least two thin films of a-C:N, a-C:F or a-C:Si to at least two of a bottom surface, an inner portion, and a top surface of the carbon anti-reflective film, wherein the at least two thin films have high selectivity and are deposited to thicknesses of 1 to 100 nm using an atomic layer deposition process;
   (c) coating a photo-sensitive film on the carbon anti-reflective film formed through (a) and (b) processes, and performing exposing and etching for the photo-sensitive film to form a pattern;
   (d) removing the photo-sensitive film after forming the pattern; and
   (e) etching the oxide film using $CF_4$ or $CHF_3$ as an etching gas having high selectivity with respect to the carbon anti-reflective film and the oxide film,
   wherein the at least two limited periods of time are non-contiguous in time such that a layer of carbon anti-reflective film is deposited between the at least two thin films, and
   wherein the adding step (b) occurs while the depositing step (a) occurs such that both the adding step (b) and the depositing step (a) simultaneously occur during the at least two limited periods of time.

7. The method as set forth in claim 6, wherein the depositing of the carbon anti-reflective film in (a) further includes applying RF power together with MF power to the semiconductor substrate having the carbon anti-reflective film deposited thereon for ionization and deposition of a carbon source gas, to form a large amount of plasma ions, and then applying the plasma ions to a wafer to cause an ion impact effect, thus increasing a density of the film, resulting in increased compressive stress.

8. The method as set forth in claim 1, wherein the adding a compound in (b) comprises adding a compound containing nitrogen (N), fluorine (F) or silicon (Si) to deposit at least two thin films of a-C:N, a-C:F or a-C:Si, having high selectivity, to thicknesses of 1 to 100 nm using an atomic layer deposition process, and
   wherein the at least two thin films of a-C:N, a-C:F or a-C:Si are deposited using an atomic layer deposition process on at least two of a bottom surface, a top surface, or an inner portion of the carbon anti-reflective film.

9. The method as set forth in claim 1, wherein the adding a compound in (b) further comprises adding a compound containing nitrogen (N), fluorine (F) or silicon (Si) at particular times during the depositing a carbon anti-reflective film, to deposit a thin film of a-C:N, a-C:F or a-C:Si, having high selectivity, to a thickness of 1 to 100 nm using an atomic layer deposition process,
   wherein the particular times are selected among the beginning of, during, or at conclusion of the depositing to selectively deposit the thin film of a-C:N, a-C:F or a-C:

Si using an atomic layer deposition process at a bottom surface, in an inner portion of, or at a top surface of the carbon anti-reflective film.

10. The method as set forth in claim 6, wherein the adding a compound in (b) comprises adding a compound containing nitrogen (N), fluorine (F) or silicon (Si) to deposit at least two thin films of a-C:N, a-C:F or a-C:Si, having high selectivity, to thicknesses of 1 to 100 nm using an atomic layer deposition process, and wherein the at least two thin films of a-C:N, a-C:F or a-C:Si are deposited using an atomic layer deposition process on at least two of a bottom surface, a top surface, or an inner portion of the carbon anti-reflective film.

11. The method as set forth in claim 6, wherein the adding a compound in (b) further comprises adding a compound containing nitrogen (N), fluorine (F) or silicon (Si) at particular times during the depositing the carbon anti-reflective film, to deposit a thin film of a-C:N, a-C:F or a-C:Si, having high selectivity, to a thickness of 1 to 100 nm using an atomic layer deposition process, wherein the particular time is selected among the beginning of, during, or at conclusion of the depositing to selectively deposit the thin film of a-C:N, a-C:F or a-C:Si using an atomic layer deposition process at a bottom surface, in an inner portion of, or at a top surface of the carbon anti-reflective film.

* * * * *